United States Patent [19]
Rosefield et al.

[11] Patent Number: 5,963,153
[45] Date of Patent: Oct. 5, 1999

[54] MULTI-STREAM AUDIO SAMPLING RATE CONVERSION SYSTEM AND METHOD USING VARIABLE CONVERTER RATE CONTROL DATA

[75] Inventors: Peter L. Rosefield, Toronto; Tieying Duan, Maple; Vladimir F. Giemborek; Hugh Chow, both of Richmond Hill, all of Canada

[73] Assignee: ATI Technologies, Inc., Thornhill, Canada

[21] Appl. No.: 08/962,147

[22] Filed: Oct. 31, 1997

[51] Int. Cl.⁶ .............................. H03M 7/00; H04L 12/54
[52] U.S. Cl. .............................. 341/61; 370/428; 704/504
[58] Field of Search ...................... 364/400.01; 381/119; 341/61, 110; 704/503, 212, 504; 375/240; 84/609; 395/299; 370/428; 369/32

[56] References Cited

U.S. PATENT DOCUMENTS

| | | | |
|---|---|---|---|
| 3,803,363 | 4/1974 | Lee | 375/240 |
| 3,949,175 | 4/1976 | Tanizoe et al. | 704/503 |
| 4,922,537 | 5/1990 | Frederiksen | 704/212 |
| 5,343,352 | 8/1994 | Maeda et al. | 369/32 |
| 5,647,008 | 7/1997 | Farhangi et al. | 381/119 |
| 5,792,971 | 8/1998 | Timis et al. | 84/609 |

*Primary Examiner*—Michael Tokar
*Assistant Examiner*—Patrick Wamsley
*Attorney, Agent, or Firm*—Markison & Reckamp, P.C.

[57] ABSTRACT

A sample rate conversion system and method uses a digital signal processor (DSP) and a separate sample rate conversion circuit (SRC) to perform multiple stream conversion and mixing of different rate input audio streams. The sample rate conversion system converts data, such as multiple streams of digital audio data sampled at different rates, and performs interpolation, decimation, FIR filtering, and mixing of multiple streams of data using the separate SRC. The SRC uses two bidirectional I/O memories for alternately storing input and output data as part of a sample rate converter. When the sample rate converter writes output to one of the bidirectional memories, it has the option of summing the data with the data already stored in the same I/O memory. Therefore a separate digital signal processor can use the sample rate converter circuit to perform some of the mixing for the multiple streams.

26 Claims, 9 Drawing Sheets

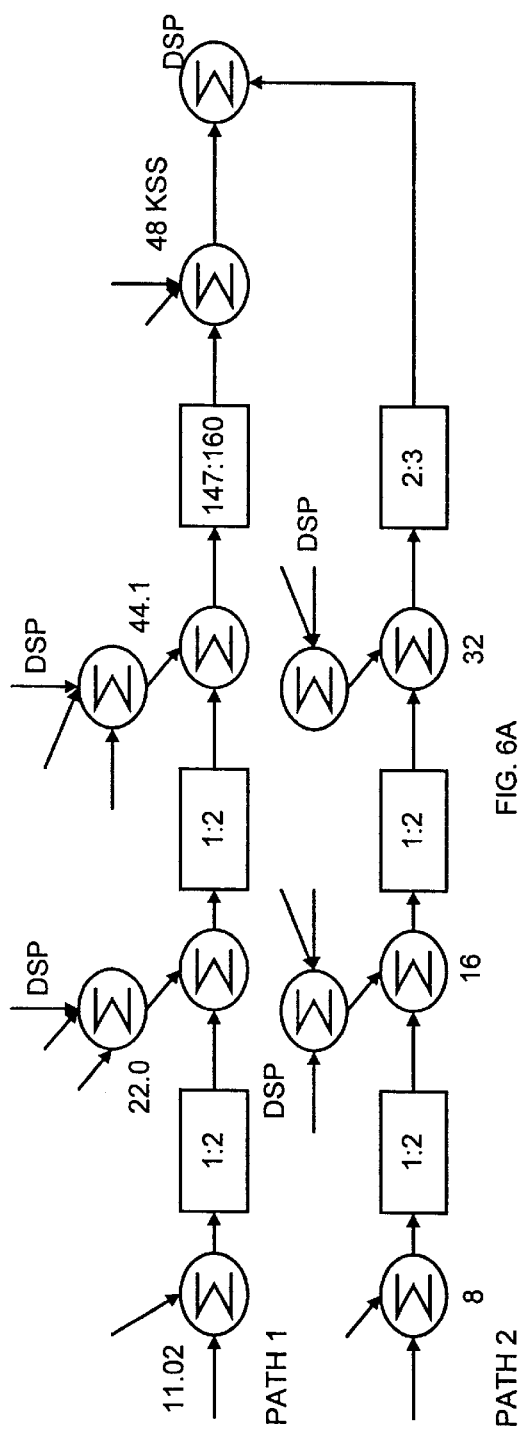
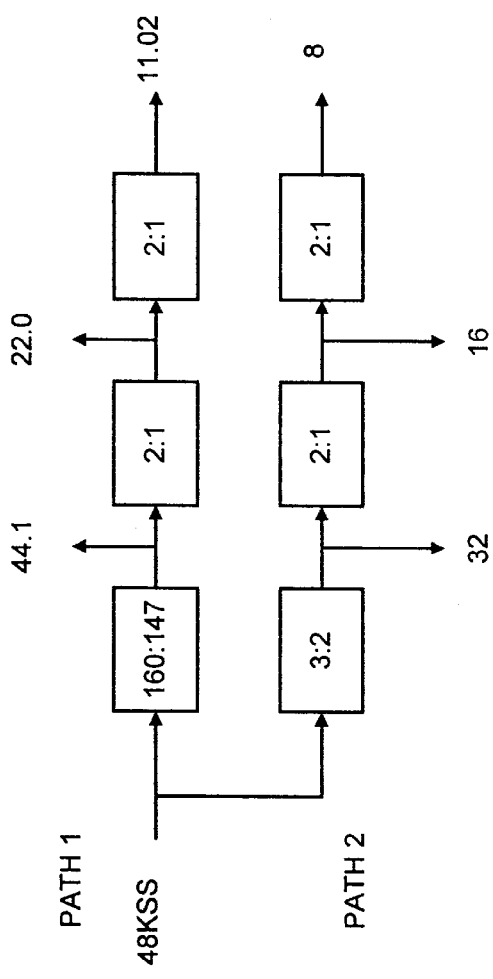
FIG. 6A
FIG. 6B

MULTI-STREAM AUDIO SAMPLING RATE CONVERSION SYSTEM AND METHOD USING VARIABLE CONVERTER RATE CONTROL DATA

RELATED APPLICATION

This application is related to a patent application entitled Multi-Stream Audio Sampling Rate Converting Circuit And Method having Ser. No. 08/962,147 filed on even date by the same inventors and assigned to the same assignee.

BACKGROUND OF THE INVENTION

The invention relates generally to audio sampling rate conversion systems and more particularly to audio sampling rate conversion systems that convert multiple streams of different rate audio.

Proposed multimedia computer standards such as Intel Corporation's AC-97 recommended standard and Intel Audio '98 Roadmap and Recommendations industry review drafts describe various desired audio subsystems for multimedia computer systems. Such proposals seek PC computer audio systems that can mix and process audio streams from numerous audio sources sampled at many different sampling rates.

When different audio streams are sampled at different rates, desirable mixing of the streams requires that the samples be converted to a common rate so that a common number of samples exist for each stream. For example, if audio from one source, such as a compact disc (CD) or digital versatile disc (DVD) is sampled at a first rate and needs to be mixed with audio sampled at a different rate from another source, such as a stored computer audio file, the audio must undergo rate conversion to be mixed by a mixer such as a digital signal processor. Also, where all audio is output through speakers coupled through the computer, the digital to analog converters for outputting analog audio for the speaker require a common sampling rate such as 48 kilosamples per second (Kss). All audio streams from all differing sources must be converted to be suitably output by the speaker drivers. In addition, real time conversion would allow mixing of real time audio input such as live audio from a modem, TV tuner or other source. Also, when performing the audio rate conversion and mixing operations on multiple audio streams, it is desirable to isolate the processing from a host PC processor to allow the host processor additional capacity to perform other functions.

Therefore, there exists a need for an audio sampling rate conversion system and method that facilitates conversion of multiple streams of different rate audio and facilitates reducing host processor intervention during rate conversion. Such a system should also facilitate mixing of the differing rate audio streams.

BRIEF DESRCIPTION OF THE DRAWINGS

The features of the present invention together with the advantages thereof, may be understood by reference to the following description taken in conjunction with the accompanying drawings wherein:

FIGS. 6A and 6B are diagrams generally illustrating multi-stage conversion of multiple audio streams in accordance with one embodiment of the invention;

DETAILED DESRCIPTION OF THE INVENTION

A sample rate conversion system and method uses a digital signal processor (DSP) and a separate sample rate conversion circuit (SRC) to perform multiple stream conversion and mixing of different rate input audio streams. The sample rate conversion system converts data, such as multiple streams of digital audio data sampled at different rates, and performs interpolation, decimation, FIR filtering, and mixing of multiple streams of data using the separate SRC. The SRC uses two bidirectional I/O memories for alternately storing input and output data as part of a sample rate converter. When the sample rate converter writes output to one of the bidirectional memories, it has the option of summing the data with the data already stored in the same I/O memory. Therefore a separate digital signal processor can use the sample rate converter circuit to perform some of the mixing for the multiple streams. Digital signal processing capabilities are enhanced by a separate sample rate converter circuit so that the DSP does not need to read converted output until it has been converted to a final rate. The DSP leaves the output in one of the two I/O memories and instructs the SRC circuit to operate on this data and put the new output in the other I/O memory.

To facilitate FIR filtering, the sample rate converter circuit includes a residue memory for storing previous data samples separately for each of the plurality of input data streams. This helps reduce the amount of data transferred from the DSP when switching streams. The SRC circuit also includes coefficient memory for storing coefficients of the various filters being used. The coefficient values are preferably written by the DSP to the SRC circuit before filtering commences.

The SRC circuit uses the two bidirectional memories to alternately convert each of the plurality of data streams to output data representing at least one input data stream as if it were sampled at a different rate based on the stored previous samples from the residue memory for each input data stream. As used herein, converting or conversion includes decimation and interpolation. The two bidirectional I/O memories sequentially receive the plurality of input data streams from the DSP but may sequentially receive small portions of different rate streams in sequence to facilitate rapid conversion of multiple streams. Under control of the DSP, the SRC circuit includes control logic that controls when the residue memory receives the data samples from a respective I/O memory.

Figure 1:
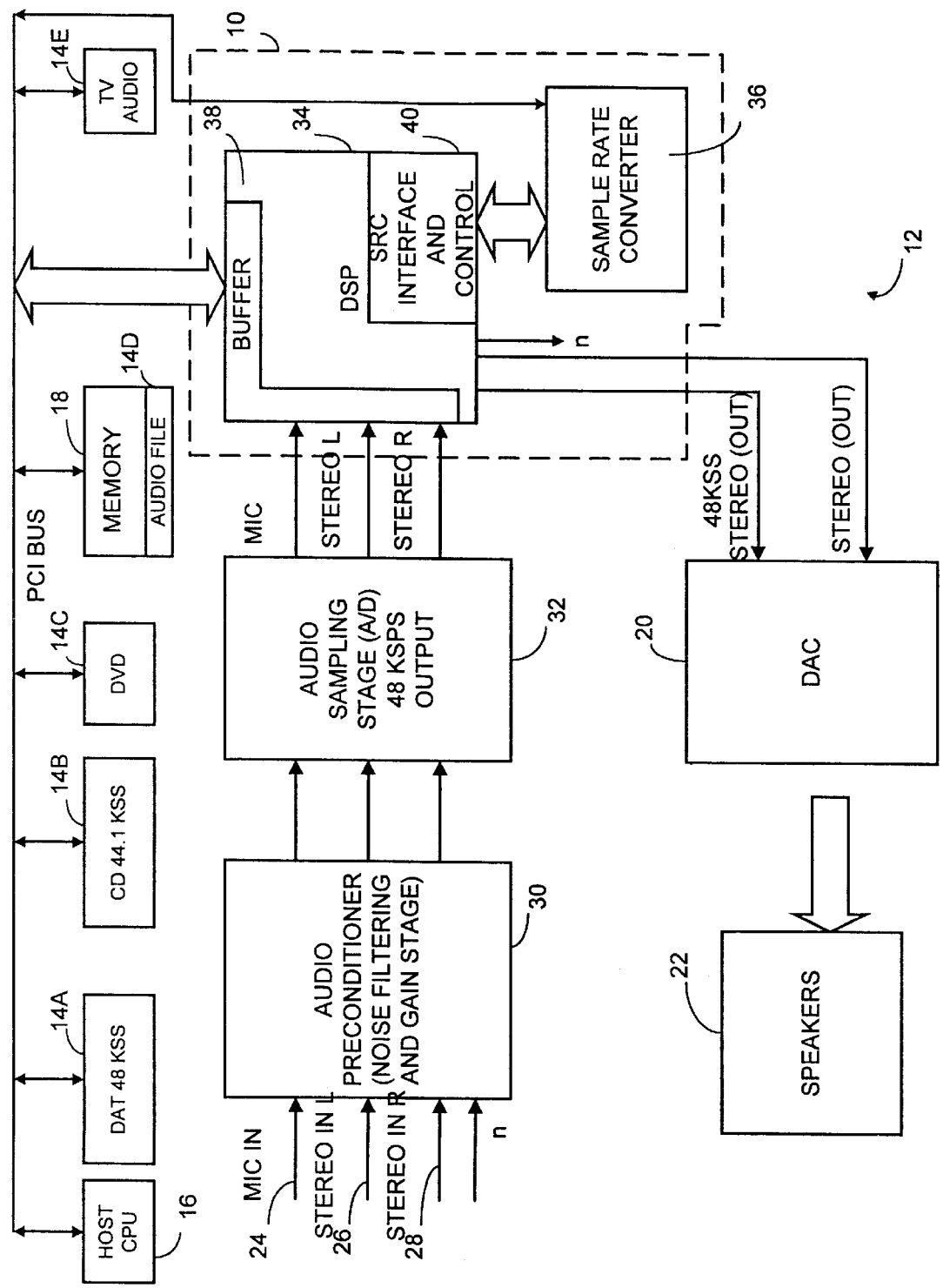
FIG. 1 is a block diagram generally depicting a sample rate conversion system for converting data sampled at different rates in accordance with one embodiment of the invention as part of a multimedia computer system.

FIG. 1 shows a sample rate conversion system 10 that serves as part of a multimedia personal computer system 12. The multimedia personal computer system 12 may be an Intel Corporation Pentium™ processor based multimedia computer system having multiple digital audio sources 14a through 14e. The multiple digital audio sources 14a through 14e may each generate audio data streams that are sampled at different sampling rates. For example, a digital audio tape drive 14a may output an audio stream sample at 48 kilosamples per second (Kss), whereas a CD driver 14b outputs digital audio streams at 44.1 Kss. Other audio sources such as a DVD player 14c, television tuner audio driver 14e or stored audio file 14d may also have differing data streams that have been sampled at different rates.

The sample rate conversion system 10 communicates to the numerous audio input data stream sources 14a–14e over a host bus, such as a PCI bus. A host central processing unit 16, such as an Intel Corp. Pentium processor also communicates over the PCI bus to the various audio sources and the sample rate conversion system 10. The multimedia computer system 12 also includes host memory 18 for storing audio sources such as stored audio files.

Generally, the sample rate conversion system 10 converts the audio streams from the various audio sources 14a through 14e into a common stream rate, namely 48 Kss and outputs the converted stream to a digital to analog converter (DAC) 20. The digital to analog converter 20 outputs analog audio to appropriate speakers 22.

The sample rate conversion system 10 receives the plurality of audio input streams and converts a portion of each stream one at a time. The sample rate conversion system 10 also mixes streams to allow audio mixing from the different audio sources. For example, if one audio stream contains background audio and another stream contains audio corresponding to an instrument such as a guitar and another stream contains audio corresponding to another instrument such as drums, the three streams can be mixed so that the output to the speakers is a composite of the audio from all three streams.

Input audio streams may come in various channels including microphone in (MIC IN) 24, stereo left 26, stereo right 28, such as from a peripheral stereo sound generating device or through the host bus. When received through MIC IN 24, and stereo left and right channels 26 and 28, an audio preconditioner 30 preconditions the audio by filtering unwanted noise and amplifying (attenuating) the input signals as necessary. Other signal preconditioning may also be performed. The preconditioned audio from audio preconditioner 30 is received by an audio sampling stage 32 (A/D converter) that digitally samples the received audio and outputs the sampled audio at 48 Kss.

The digitized input data streams from the audio sampling stage 32 or from the host PCI bus are sent to the sample rate conversion system 10 which includes a digital signal processor 34 and a sample rate converter circuit 36. Preferably, the digital signal processor 34 and sample rate converter circuit 36 are located on the same integrated circuit but the digital signal processor 34 is a separate circuit from the sample rate converter circuit 36. The digital signal processor 34 has a set of buffers 38 for receiving the plurality of input data streams. The digital signal processor 34 also includes sample rate converter interface circuitry and some SRC control circuitry 40. The SRC interface control circuitry 40 among other things, generates variable converter rate control data to facilitate a programmable conversion of the input data streams by the SRC. Sample rate converter 36 receives the plurality of input data streams from the digital signal processor through internal bidirectional I/O memories (e.g., buffers).

If desired, the host computer can control the sample rate converter 16 directly over the PCI bus. This may be useful for test purposes or if the DSP is too busy to process some data streams.

Figure 2:
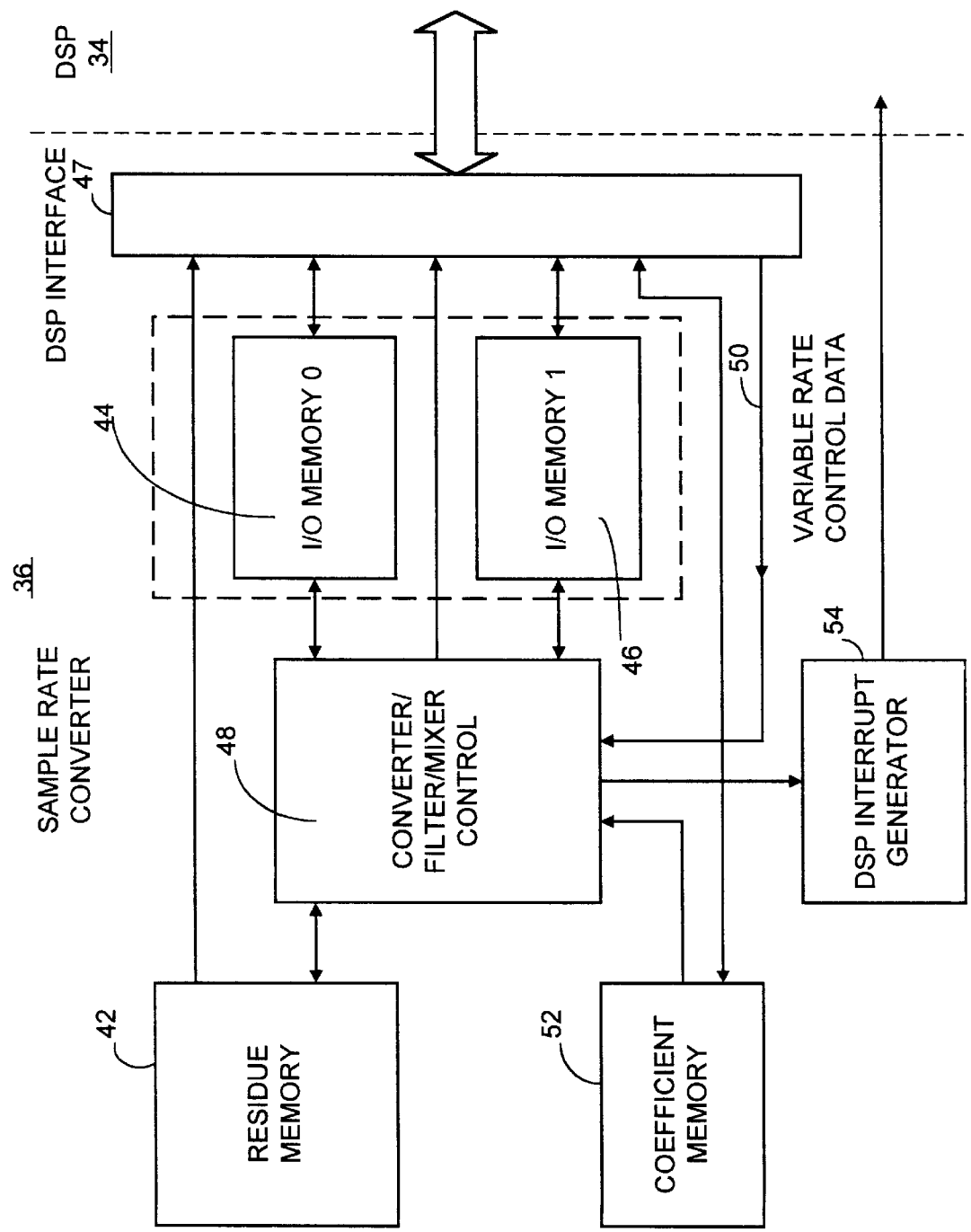
FIG. 2 is a block diagram generally one embodiment of a sample rate conversion circuit in accordance with one embodiment of the invention.

FIG. 2 shows the sample rate converter 36 which includes residue memory 42 for storing previous data samples separately for each of the plurality of input data streams for use in filtering of each stream. Residue memory 42 also stores current samples. Sample rate converter 36 also includes a first bidirectional memory 44 (I/O 0) and a second bidirectional memory 46 (I/O 1) that receive the plurality of data input streams from the DSP. The SRC 36 also includes a DSP multistream conversion interface 47 to facilitate conversion, mixing and communication with the DSP as further described below. Control logic 48 receives variable rate control data 50 from the DSP through the DSP multistream conversion interface 47 and alternately converts each of the plurality of input data streams to output data representing an input data stream as if it were sampled at a different rate based on the stored previous samples in the residue memory 42 for each input data stream. The control logic may be a microprocessor or other suitable logic. As set forth in more detail below, the I/O memory 0, 44 and I/O memory 1, 46 facilitate multistream rate conversion by storing output data and input data streams alternately for differing streams of input data.

Sample rate converter 36 also includes coefficient memory 52 that stores the filter coefficients when the control logic 48 filters an input data stream to facilitate conversion. The coefficient memory 52 stores sets of filter coefficients corresponding to each of the plurality of predetermined conversion filters, such as interpolation filters and decimation filters, to facilitate conversion of the multiple input data streams. Periodically, the control logic 48 generates an interrupt using DSP interrupt generator 54 to notify the DSP of rate conversion completion and retrigger notification.

The bidirectional I/O memories 44 and 46 sequentially receive the plurality of input streams from the DSP and store the converted output data as set by the DSP based on the variable rate control data 50. Each of the bidirectional memories 44 and 46 are individually selectable by the control logic 48 during conversion, so that each of the first and second bidirectional memories 46 and 48 supplies one of the input streams for conversion and can store converted output data samples to facilitate multi-input stream conversion. The residue memory 42 stores the previous data samples separately for each input data stream to facilitate a reduction in the amount of data transferred from the digital signal processor when switching input data streams. Data is overwritten in the I/O memories 44 and 46 as needed to facilitate conversion and mixing of audio streams. The I/O memories 44 and 46 facilitate mixing of multiple audio streams and multistage conversion as further described below.

Figure 3:
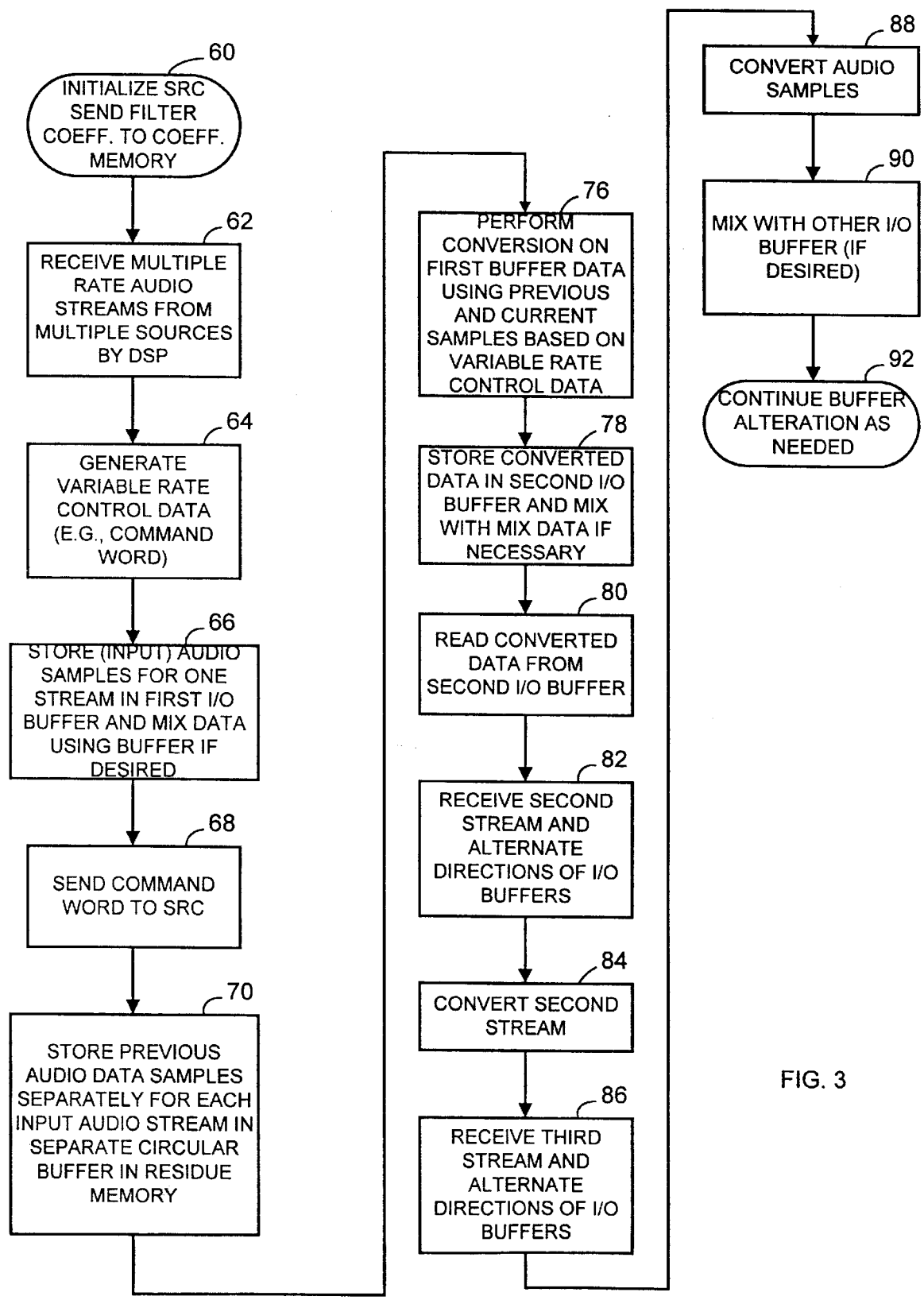
FIG. 3 is a flowchart generally depicting one embodiment of the operation of the sample rate conversion system of FIG. 1.

FIG. 3 generally illustrates the operation of the sample rate conversion system 10 wherein the DSP 34 initializes the sample rate converter circuit 36 as shown in block 60 by sending filter coefficients to the coefficient memory 52. The DSP 34 receives multiple rate audio streams in buffer 38, from audio sources 14a–14e or from audio sampling stage 32, as indicated in block 62. Prior to communicating the received input audio stream data to the SRC for conversion, the DSP 34 generates the variable rate control data 50, such as a command word or set of command words as shown in block 64. The variable rate control data 50 sets the memories 44 and 46 one as input and one as an output buffer. The I/O memory set as an input buffer stores the audio samples received from the DSP as indicated by block 66. As shown in block 68, the DSP sends the variable rate control data 50 to the DSP interface 47 of the sample rate converter 36. The DSP 34 also determines which audio is being transferred to the sample rate converter and the amount of conversion or mixing necessary. The control logic 48 uses a single filter that is periodically reconfigured for multi-stage conversion (see FIGS. 6A and 6B).

To perform filtering as part of the conversion process, the residue memory 42 stores previous and the current audio data samples from previous and the current conversion streams in a separate circular buffer for each stream. This is shown in block 70. At the same time, the control logic 48 performs conversion (including filtering) on the data in the first buffer, as shown in block 76. After conversion and filtering is complete, the control logic 48 stores the converted data in the second I/O buffer that is set as the output buffer as shown in block 78. An interrupt is sent by the DSP interrupt generator 54 to the DSP notifying the DSP that conversion is complete. The DSP then reads the converted data from the second I/O buffer as shown in block 80.

Once conversion has been completed for samples for one stream, the DSP sends samples from another stream and commands the control logic 48 to alternate from the current I/O memory and convert data in the other I/O memory as shown in block 82. However, the same I/O memory can be used to receive the second stream. Sample rate converter 36 then converts the second stream in a similar fashion as the first stream as shown in block 84. If the SRC is converting a once converted stream, alternate I/O memory is used to convert the once converted stream. The process is continued on the third stream as shown in blocks 86 and 88.

If desired, the sample rate converter 36 also mixes audio samples after conversion to help increase the speed of the DSP. This is shown in block 90. The processes continue as needed to facilitate a conversion of multiple differing audio input streams as shown in block 92.

Figure 4:
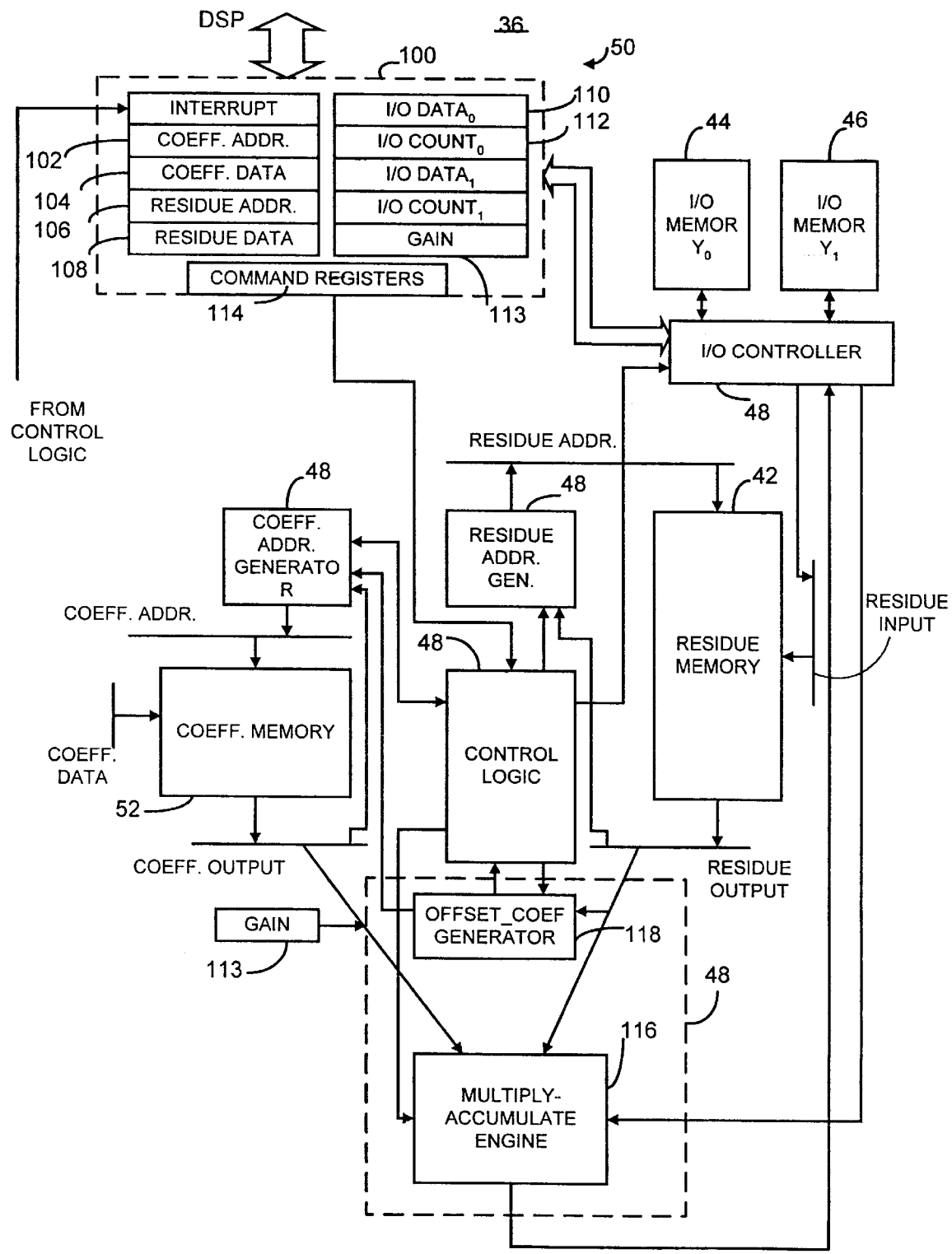
FIG. 4 is a block diagram showing in more detail the embodiment of the sample rate conversion circuit of FIG. 2.

FIG. 4 is a block diagram showing in more detail the sample rate converter 36 having a DSP interface register block 100 that serves as the DSP interface 47. Among other things, the DSP interface register block 100 contains the variable converter rate control data 50. The variable rate control data 50 includes any or all of the following data: coefficient address data 102, coefficient data 104, residue address data 106, residue data 108, I/O data 110, I/O count data 112 and command register data 114. The DSP interface 100 facilitates the use of a small number of addresses to be dedicated to the SRC. For example, instead of having an address dedicated to each address in the I/O memories 44 and 46, the residue memory 42 and the coefficient memory 52, the DSP retrieves data from the residue memory 42 using residue address and residue data registers 106 and 108. Similarly, the DSP can access any address within the coefficient memory 52 through coefficient address 102 and coefficient data register 104. Also, the I/O memory is accessible through I/O data registers 110 and 112.

The control logic 48 controls the SRC based on the command registers 114. The control logic 48 includes a coefficient address generator, a residue address generator and an I/O controller as shown. The control logic 48 also includes a conversion engine 116 (filter and mixing stage) which performs a multiply-accumulate operation to produce one output sample. The control logic 48 utilizes an offset generator 118 to effect efficient decimation and interpolation as further described below. The control logic 48 controls the conversion engine 116 using the offset generator 118 to selectively perform multiply-accumulate FIR filtering operations. The conversion engine 116 multiplies a filter coefficient from coefficient memory 52 with a previous or current sample from residue memory 42 for FIR filtering to facilitate rate conversion.

The control logic uses filter registers to facilitate filtering of input data samples in I/O memories 44 and 46. At the start of each conversion, the filter registers are loaded with data indicating the type of filter and other filter related data from memory locations in the residue memory and the coefficient memory. Hence, through the command registers 114, the DSP instructs the SRC as to the type of interpolator, filter and decimator to use and the stream that it is operating on. The filter registers contain information which the DSP writes indicating an up-sampling rate L, a down-sampling rate M, the number of samples needed to produce one output, res_len and the address of the first coefficient, coef_start. This information is preferably stored in consecutive words at the start of the coefficient memory 52. In the preferred embodiment, six bits of a command word are reserved for the DSP to specify which filter to use. The SRC may have up to 64 different filter types if desired. It will be recognized by one of ordinary skill in the art that any suitable number of different filter types may also be used.

The data for the filter register is stored prior to filter operation. If the DSP only requires nine filter types, only the first eighteen words in coefficient memory 52 would contain this data and the necessary coefficients could be stored starting in word nineteen. When the DSP instructs the SRC to do a conversion, the words of coefficient memory 52, specified by the command word in the variable rate control data 50 are read into the relevant registers of the coefficient and residue address generators by the control logic.

The residue memory 42 is preferably configured as a number of circular buffers, with one circular buffer for each separate input audio stream. The control logic 48 controls when the residue memory 42 receives the data samples from the I/O memory 44 and 46, one stream at a time, separately for each separate input stream based on the variable control data 50. When new data needs to be read from the I/O memory 44 and 46, the residue memory 42 replaces the oldest piece of data with the new data. The residue memory 42 contains registers indicating the address of the start of the residue memory, res_start; the position of the first residue data in the residue memory, res_cur, and the position of the next or current coefficient to use for filtering, offset_coeff Preferably, this data is stored in two words at the start of residue memory 42. The DSP has six bits in the command word to specify one of sixty-four streams of digital input audio. The residue memory 42 is adaptive in that if fewer streams are used, residue data can start directly after the pair of words which define the last stream. The offset_coeff and res_cur values are saved in the residue memory 42 when the SRC switches to a different input audio stream. Preferably, the SRC will not switch streams until all of the contents of the input I/O memory are used. When the SRC switches back to a certain stream, offset_coeff and res_cur will be loaded from memory and filtering continues. Hence the control logic 48 alternately converts each of the plurality of input data streams in response to the variable converter rate control data 50 to effect a programmable conversion of the input data streams.

Figure 5:
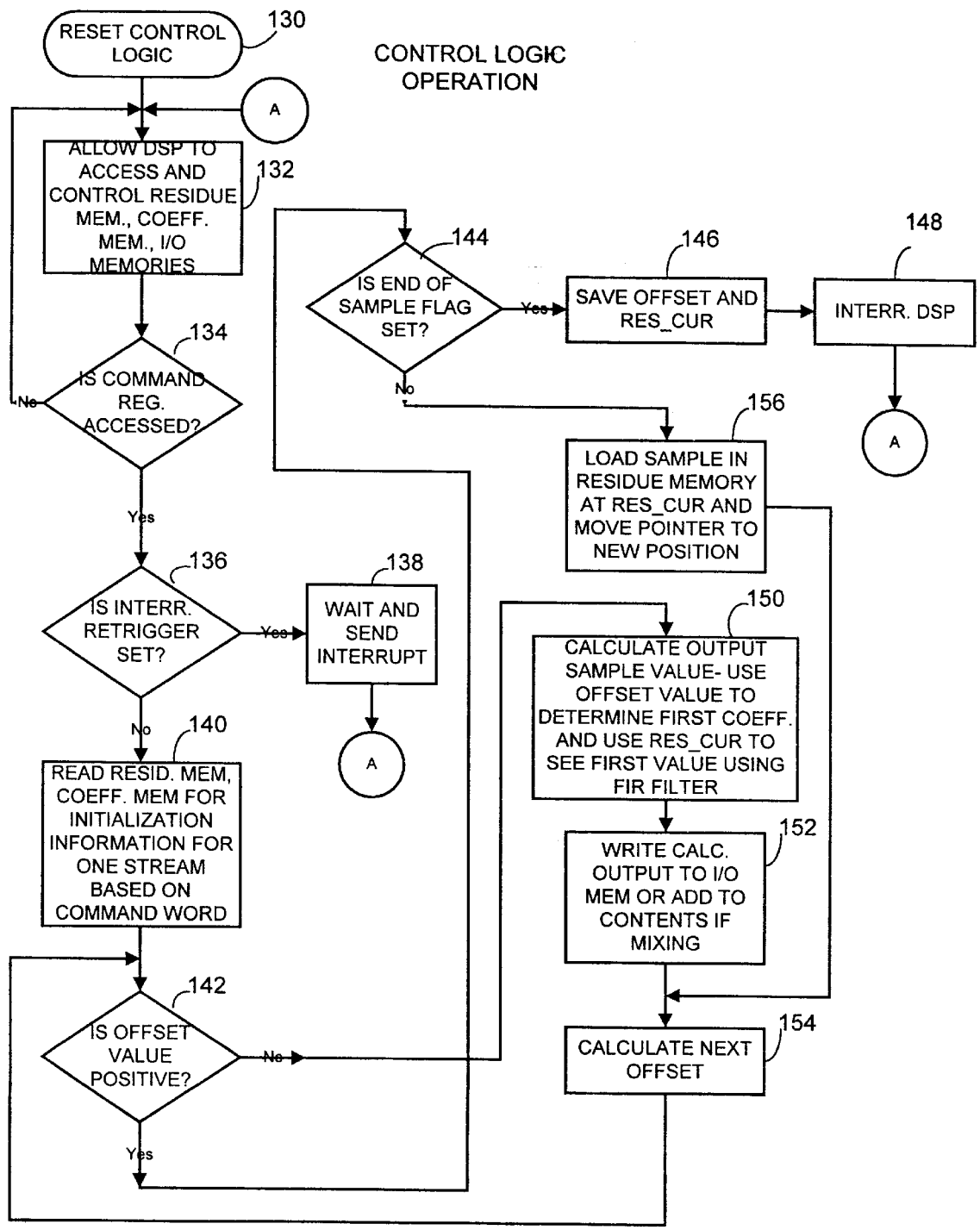
FIG. 5 is a flowchart generally depicting one embodiment of control logic operation in accordance with the invention.

FIG. 5 is a flowchart showing an embodiment of the control logic 48 operation wherein the control logic is reset as shown in step 130 by the DSP. The SRC switches to allow the DSP to access and control the residue memory, coefficient memory and I/O memories. The DSP then downloads the filter coefficients for each of these filters in coefficient memory. This is shown in block 132. Next, the SRC determines whether the command registers 114 have been accessed by the DSP as indicated in block 134. If the command registers have not been accessed, the SRC waits in a standby mode to allow the DSP to access command registers. However, if the command registers have been accessed, the SRC determines if the interrupt retrigger is set as shown in block 136. If the interrupt retrigger has been set, the SRC waits and sends an interrupt to the DSP indicating that it is waiting for the DSP to return and service the interrupt, as shown in block 138.

If the interrupt retrigger is not set, the control logic 48 reads the residue memory 42 and coefficient memory 52 for initialization information for one stream of audio data based on the command word as shown in block 140. In block 142, the control logic determines if the offset value from the offset generator 118 is positive. The offset generator 118 determines when to skip a multiply-accumulate operation to enhance the speed of filtering. In other words, the offset generator 118 is used to select the coefficients and data inputs for the multiply-accumulate operation to reduce the multiplications with zero valued data inputs during interpolation, and to skip multiply-accumulate passes for discarded outputs during decimation.

If the offset value is positive, the control logic determines if the end of the sample flag has been set indicating the end of the range of samples for the stream as shown in block 144. If the control logic determines that an end of the sample has not occurred and offset_coeff is greater than zero, the control logic loads the sample in residue memory at the res_cur location and moves the pointer to a new position as shown in block 156. The control logic then calculates the next offset as shown in block 154. This logic continues as needed until no samples are left. If the end of the sample flag has been set, the SRC saves the offset value and the value in the res_cur register as shown in block 146 so that the SRC can come back to this stream later when more inputs are received from the DSP. After the offset information and current residue pointers have been set, the SRC generates an interrupt to the DSP as shown in block 148 indicating that the conversion operation is complete for that stream.

Referring back to block 142, if the offset value is not positive, the SRC calculates the output sample value by using the offset value to determine the first filter coefficient (offset_coeff. +L). The SRC also uses the res_cur data to see what the first value sample is for using the FIR filter. This is shown in block 150. The control logic 48 calculates the conversion output on a per sample basis and writes it to the I/O memory set as output when the SRC is commanded to perform a conversion as shown in block 152. If the DSP has commanded the SRC to mix different audio streams, the control logic 48 causes the contents from one I/O memory to be mixed with the contents of the other I/O memory and stores the mixed data in an I/O memory set as output. The SRC then calculates the next offset as shown in block 154 and determines if the offset value is positive, as shown in block 142.

FIG. 6a diagramatically represents a multi-stage conversion process as carried out by the SRC 36. By way of example, if an input audio stream has been sampled at a rate of 11.02 Kss and other multiple streams exist, the sample rate converter 36 will sequentially convert and mix those streams as necessary to obtain a 48 Kss output stream. If desired, the DSP will sum all streams of the same rates and pass the summed stream data to the SRC for further conversion.

Two paths are shown wherein path one shows multiple streams being converted and mixed and undergoing 1:2 interpolation in two stages, and another 147:160 conversion stage resulting in a 48 Kss stream being generated. The conversion stages are generated by reconfiguring the FIR filter as needed for each conversion. Path two shows an 8 Kss stream being converted by interpolation to a 16 Kss sample stream, and other 16 Kss streams being first summed by the DSP and then summed by the SRC with the converted 16 Kss stream. The combined 16 Kss stream is then converted through a 1:2 interpolator stage to a 32 Kss stream. If present, other 32 Kss streams are summed together by the DSP and the resulting 32 Kss streams are then mixed by the SRC with a converted 32 Kss stream. These streams are interpolated using a 2:3 interpolation stage by the SRC resulting in a 48 Kss output stream. The 48 Kss streams from paths one and two are mixed by the DSP and serve as the output going to a set of speakers.

FIG. 6b graphically illustrates multistage conversion using decimation by the sample rate converter 36 wherein in a 48 Kss stream undergoes decimation through a 160:147 stage resulting in a 44.1 Kss stream. As shown, two 2:1 decimation stages then convert the resulting converted streams down to a 11.02 Kss stream. Path two shows a 48 Kss stream being converted down to an 8 Kss stream using a 3:2 decimation stage and two 2:1 decimation stages.

Therefore the SRC 36 receives multiple audio streams being sampled at different rates and sequentially converts streams using multi-stage conversion to obtain a common output stream. Conversely, the SRC 36 generates multiple audio streams at different rates from one or more streams and sequentially converts streams using multi-stage conversion to obtain a plurality of output streams. Moreover, repeatedly using the same ratio of decimators (2:1) reduces the filter complexity and requires use of fewer filter coefficients than if single stage conversion was used.

Figure 7:
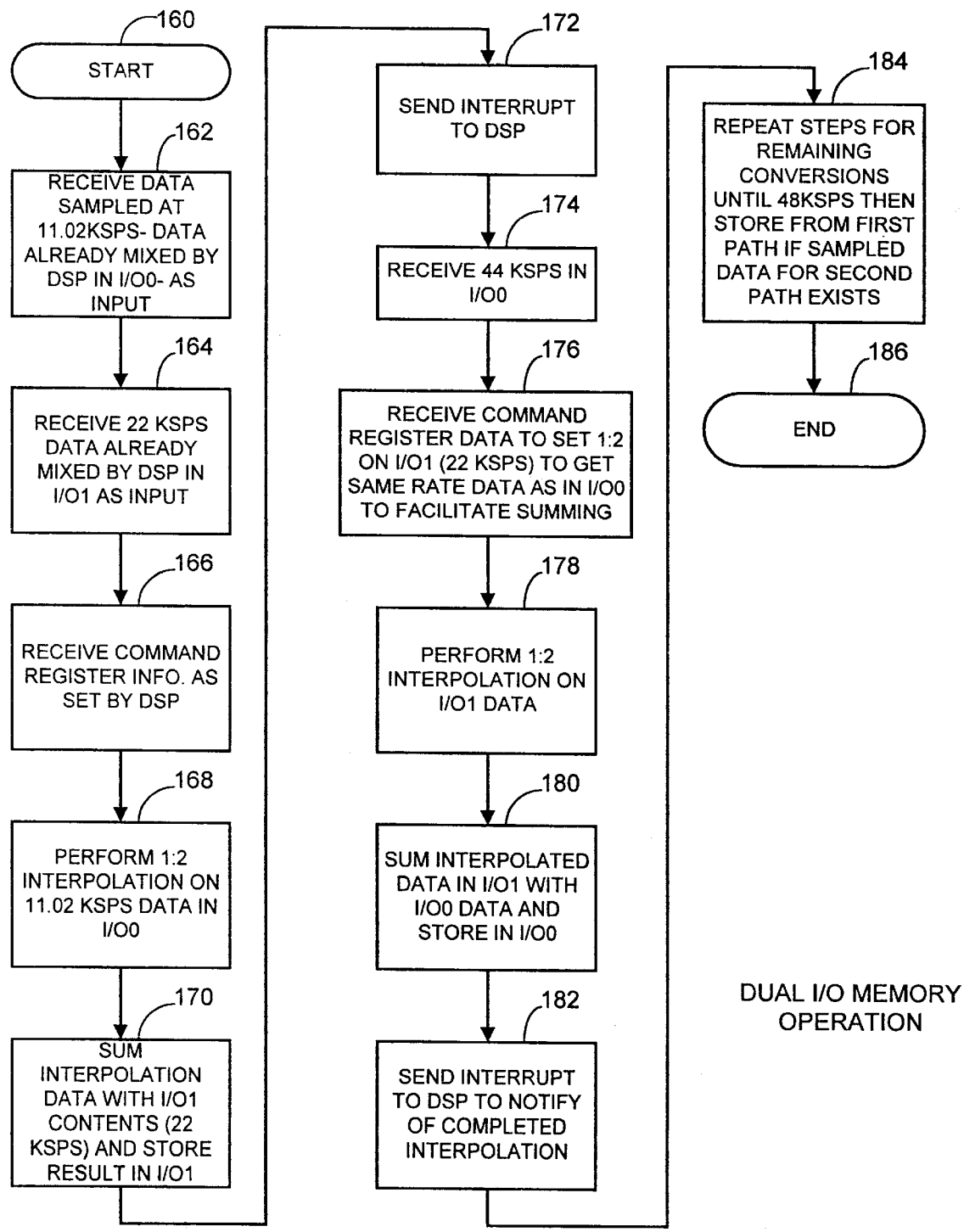
FIG. 7 is a flowchart generally showing an example of conversion carried out by dual I/O memories in accordance with one embodiment of the invention.

FIG. 7 shows an example of using the dual bidirectional I/O memories 44 and 46 to perform multistage interpolation and mixing to generate a 48 Kss signal from lower sample rate audio streams. Off loading the mixing from the DSP can improve DSP performance and hence computer system performance. The control logic 48 controls the bidirectional I/O memories 44 and 46 to facilitate multistage conversion by controlling the memories to store converted data in the one bidirectional memory and again converting the converted data to again converted data and storing the twice converted data in the other bidirectional memory for output.

The dual I/O memory operation starts in block 160 and the SRC receives data sampled at 11.02 Kss which is data already mixed by the DSP, in I/O memory 0 as input. This is shown in block 162. In block 164, the SRC receives another stream of 22 Kss data that has already been mixed by the DSP in I/O memory 1 as input. The control logic sets the I/O memories in a state for receiving data from the DSP representing differing rate signal samples. As part of the command register information set by the DSP, the DSP commands the sample rate converter to perform 1:2 interpolation on the 11.02 Kss data in I/O memory 0 as shown in blocks 166 and 168.

As shown in block 170, the sample rate converter 36 sums the interpolation data from I/O memory 0 with the contents of I/O memory 1 and stores the results in I/O memory 1. The SRC then uses DSP interrupt generator 54 to send an interrupt to the DSP, as shown in block 172 to inform the DSP that the conversion and mixing has been completed. To mix another stream at a different rate, the SRC receives for example a data stream sample at 44 Kss in I/O memory 0 as shown in block 174. The DSP sends the command register data to the SRC and instructs the SRC to set the conversion to 1:2 conversion on I/O memory 1 (which contains data sampled at 22 Kss) to obtain the same rate of data as stored in I/O memory 0 to facilitate mixing. This is shown in block 176. The SRC then performs 1:2 interpolation on the audio samples in I/O memory 1 as shown in block 178. The resultant samples are a 44 Kss collection of samples. These samples are summed with I/O memory 0 data and the resultant mixed 44 Kss is stored in I/O memory 0 as shown in block 180. The SRC then sends an interrupt to the DSP to notify the DSP of the completed interpolation shown in block 182. The command, conversion and mixing steps are repeated for the remaining conversions until a stream representing a 48 Kss stream results as shown in block 184. The resultant 48 Kss data stream is then output to the speakers as shown in block 186 where the process ends until another or more of the same audio data stream is received by the DSP.

Figure 8:
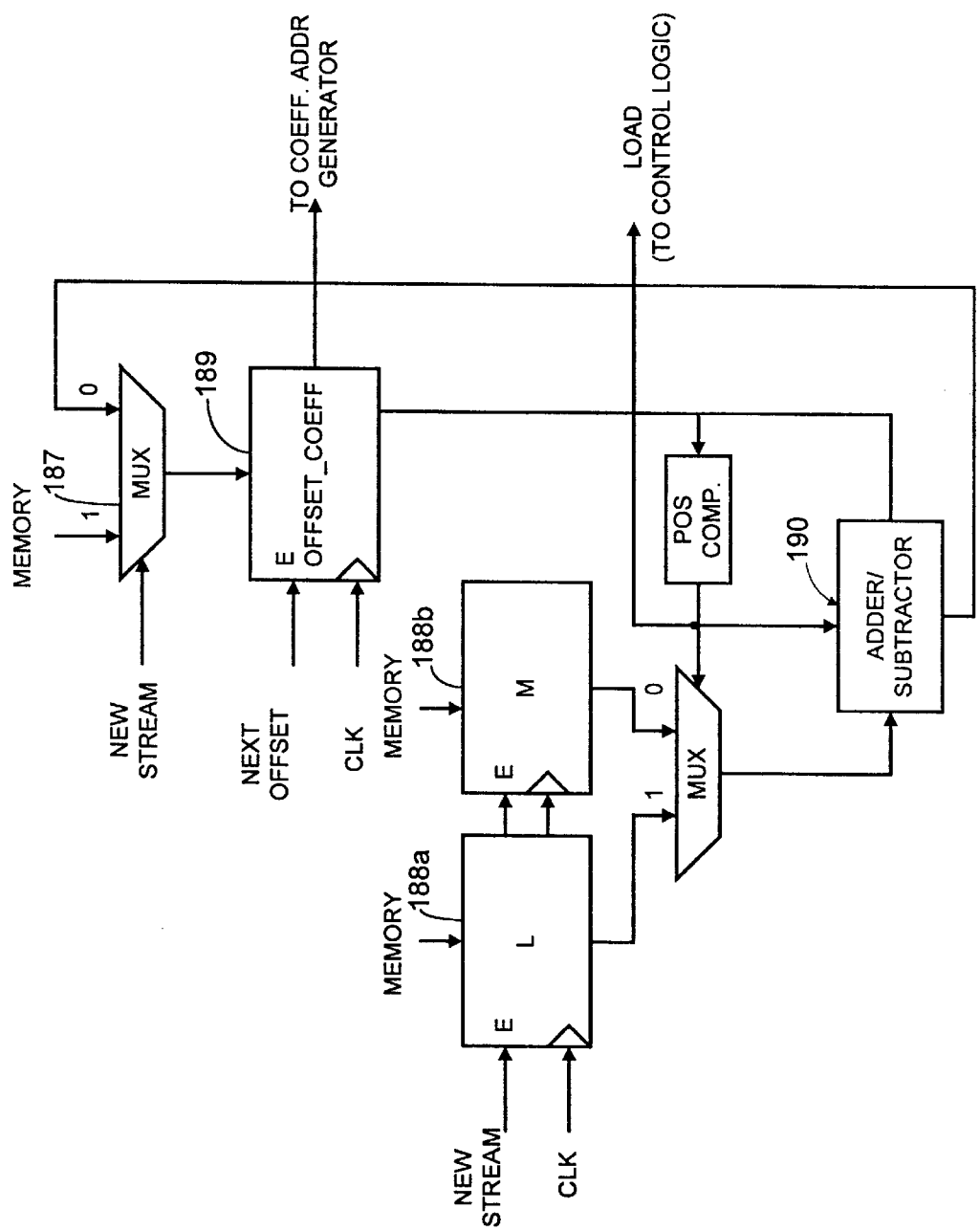
FIG. 8 is a block diagram generally depicting circuitry for facilitating filter coefficient offset generation in accordance with one embodiment of the invention.
Figure 9:
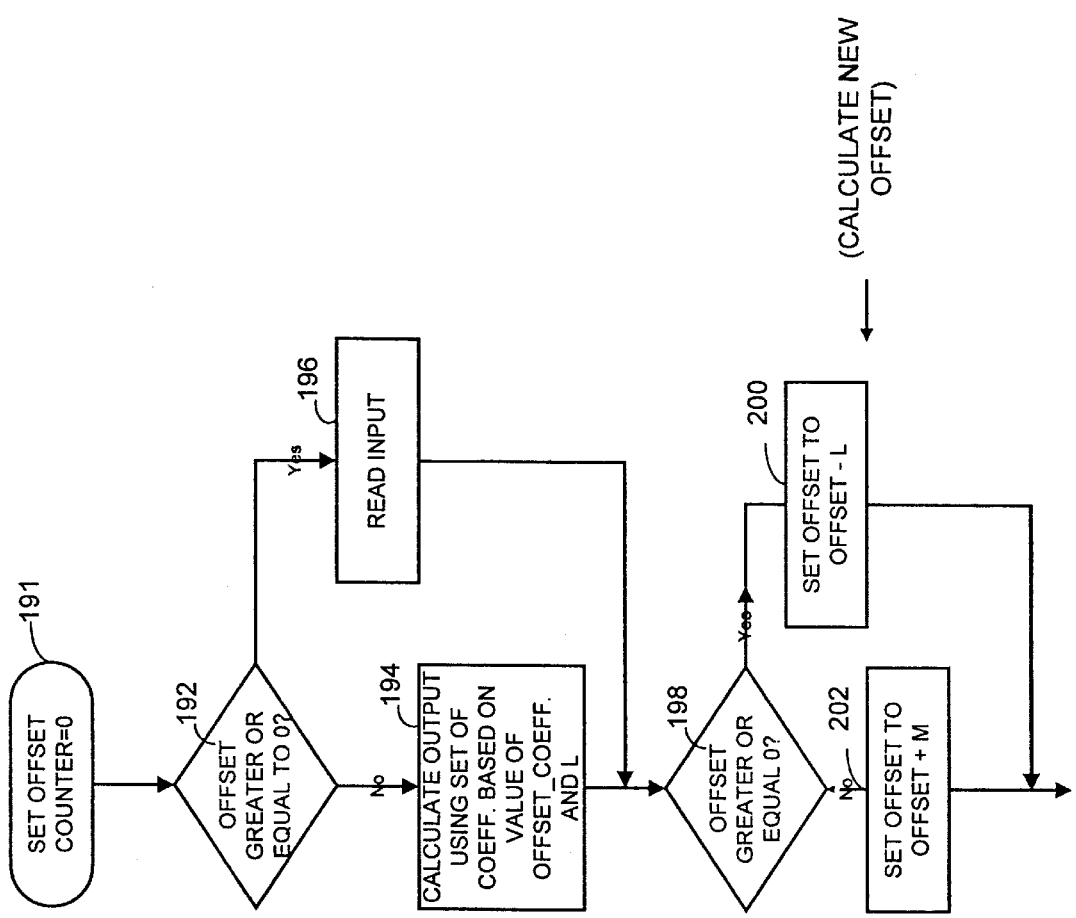
FIG. 9 is a flowchart generally depicting the operation of the offset circuit of FIG. 8.

FIGS. 8 and 9 generally depicts the offset generator 118 and the operation of the offset generator 118. For FIR filtering, during the convolution process, previous input data samples are repeatedly used with different filter coefficients. In contrast to many conventional FIR filtering techniques, the offset generator 118 reduces the required clock cycles during filtering by allowing the control logic to skip multiplications and either calculate a new output or obtain a new input sample based on a determined offset value in response to stored up-sampling rate data and down sampling rate data.

To start filtering on a new stream, the new stream input bit is set high to enable a mulitplexer 187 to load the offset value form memory and load the up-sampling rate data, L, and down sampling rate, M, data from memory to registers 188a and 188b. In addition, the offset_coeff value is supplied from memory. To calculate a next offset_coeff value, the next_offset input is set high for register 189. The next value of offset_coeff is ouptut by adder/subtactor 190 based on whether the previous value was positive or negative as determined by a comparator. If positive (or equal to zero), L is passed to adder/subtractor 190, and if negative, M is passed to adder/subtractor 190. The control logic uses the comparator output to determine the next action of whether to load a next sample or calculate a next output.

As an illustration, for a 2:3 conversion, where x is a sample in a given input stream of . . . x5, x4, x3, x2, x1 where x1 is the earliest sample and c is a coefficient and L=3, the upsampled stream would be . . . , 0, 0, x5, 0, 0, x4, 0, 0, x3, 0, 0, x2, 0, 0, x1. After filtering conventional convolution would result in multiplications as generally illustrated below:

$$x1*c0$$

$$0*c0 + x1*c1$$

$$0*c0 + 0*c1 + x1*c2$$

$$x2*c0 + 0*c1 + 0*c2 + x1*c3$$

$$0*c0 + x2*c1 + 0*c2 + 0*c3 + x1*c4$$

$$0*c0 + 0*c1 + x2*c2 + 0*c3 + 0*c4 + x1*c5$$

$$x3*c0 + 0*c1 + 0*c2 + x2*c3 + 0*c4 + 0*c5 + x1*c6$$

Where M=2, the resulting output would be:

$$x1*c0$$

$$x1*c2$$

$$x2*c1 + x1*c4$$

$$x3*c0 + x2*c3 + x1*c6$$

With the offset generation mechanism, where L=3, M=2, the number of coefficients=9 and res_len=3 the following information would be determined as described below.

| OFF-SET | ACTION LOAD/CALC | RESIDUES | COEFF. OUTPUT |
|---|---|---|---|
| 0 | | 0 0 0 | Initially offsets and residues set = 0 |
| 0 | load | x1 0 0 | |
| −3 | calc | | c0 c3 c6  x1*c0 |
| −1 | calc | | c2 c5 c8  x1*c2 |
| 1 | load | x2 x10 | |
| −2 | calc | | c1 c4 c7  x2*c1 + x1*c4 |
| 0 | load | x3 x2 x1 | |
| −3 | calc | | c0 c3 c6  x3*c0 + x2*c3 + x1*c6 |
| −1 | calc | | c2 c5 c8  x3*c2 + x2*c5 + x1*c8 |
| 1 | load | x4 x3 x2 | |

At initialization, the offset counter is set to zero in the residue memory location corresponding to the desired stream, as shown in block 191. The SRC then checks the offset counter to determine if the offset is greater or equal to zero as shown in block 192. If the offset counter value is greater or equal to zero, a sample is loaded if there are more inputs. This is shown in block 196. If the value in the offset counter is not greater or equal to zero (i.e., negative), the SRC converts (an output is calculated) using the coefficients starting from the location "offset_coeff+L" where L is the up-sampling rate as shown in block 194. The SRC then determines whether offset_coeff is greater or equal to zero as shown in block 198. If offset_coeff is greater or equal to zero, the value in the offset_coeff counter is set to "offset_coeff−L" as shown in block 200. This calculates the new offset. The SRC then continues to evaluate whether the offset is greater or equal to zero as shown in block 192. If however the SRC determines that the offset is not greater or equal to zero from block 198, the value in the offset counter is set to "offset_coeff+M" where M is the down-sampling rate. This is shown in block 202.

Therefore, when the SRC is instructed to operate, offset_coeff is loaded from the residue memory at the address specified by the command word. Once offset_coeff is loaded, the sign is used to determined what the next step should be. If the sign is positive or zero, the SRC recognizes that it is time to load the next input into the residue memory. If the sign is negative, the SRC recognizes that it is time to calculate one output with the sample currently in residue memory and the next set of coefficients in memory. Also, the offset generator 118 includes an enable pin referred to as next_offset that when set high, the next clock will cause the next value in the offset to be calculated. When set low the previous offset is maintained.

Hence, for filtering, the control logic determines which input samples are zero valued to more efficiently interpolate based only on L, M and the previous action of the control logic. Similarly, the control logic determines which outputs are discarded for decimation based only on L, M and the previous operation of the control logic. The offset generator generates the offset value and the control logic selects filter coefficients and data inputs for a multiply-accumulate operation, based on the offset value, to reduce the multiplications with zero valued data inputs during interpolation, and skip multiply-accumulate passes for discarded outputs during decimation. As a result, based on the offset value, the control logic skips the calculation of input samples that are determined to be zero values or outputs that are to be discarded thereby reducing the number of cycles to complete conversion by the number of coefficients used for a given filter.

The process of determining new offset_coef values and acting on them continues until the SRC runs out of input samples when the next step is to load an input sample. At this point, the residue values are left in residue memory and the value of offset_coef is saved for later use. When more input samples are available for this stream, the stored offset value is loaded from memory and conversion continues as stated above. If desired, the SRC may stop the conversion process and store the offset and residue data for later use at any time instead of when no more input samples are available. The SRC may store the offset and residue data for multiple streams as well as the filter coefficients and values for L and M for multiple streams. This allows the SRC to switch between streams as commanded by the DSP and the DSP can load any suitable number of input samples for any suitable number of streams, and preferably loads one stream at a time.

The SRC also includes gain control to facilitate higher precision filtering during the filter multiply-accumulate phase. Prior to being stored in the SRC, filter coefficients may be normalized by multiplying each filter coefficient by a normalizing factor, such as 1/gain. The programmer chooses the normalizing factor to normalize or scale the coefficient range to fit within a fixed bit range of the filter coefficient storage mechanism. This results in the largest coefficient entirely fitting within the range of allowable coefficients. Such a technique helps reduce coefficient quantizing error. The multiply accumulate conversion engine 116 uses these normalized coefficients during filtering and subsequently multiplies all outputs by a corresponding gain factor that may be for example the inverse of the normalizing factor, to bring the coefficients back to normal. Also, interpolation by L typically causes a reduction in signal energy by L, therefore the gain factor may be increased to cancel this effect.

To further illustrate the operation of the above described system, and by way of example only, below is a list of some possible SRC control data and associated descriptions for use in controlling an SRC in the system 10 as disclosed above. These examples are 24 bit words but may be any suitable length. As shown, multiple command words (SRC_CMD) may be used along with SRC state commands, SRC I/O memory commands (SRC_IOMEM), SRC coefficient memory commands (SRC_COEF) and SRC residue memory commands (SRC_RES). This list is for illustrative purposes only. It will be recognized that these command words and associated registers are but one way of implementing aforedescribed operations and that other designs may be suitable.

| Field Name | Bit(s) | Description |
|---|---|---|
| | | SRC_CMD_0 |
| SRC_STREAM_ID_0 | 23:18 | Selects Stream ID |
| SRC_FILT_ID_0 | 17:12 | Selects Filter ID |
| SRC_CMD_SET_SIZE | 11:10 | Number of Commands being issued. First instruction is in SRCCMDx where x = SRCCMD0[22:21]. Last instruction is in SRCCMD0 |
| SRC_IO_INDEX_0 | 9 | 0 = IO0 for input, IO1 for output, 1 = IO0 for output, IO1 for input |
| SRC_OUTPUT_MIX_0 | 8 | 0 = Don't Mix SRC Output with Output Memory Contents, 1 = Add SRC Output to Output Memory Contents. |
| (Reserved) | 7:3 | |
| SRC_USE_GAIN_0 | 1 | 0 = Multiply all outputs by L 1 = Multiply all outputs by SRC GAIN |
| SRC_RETRIG | 0 | 0 = Start Conversion (when written to), 1 = send another Interrupt |
| | | SRC_CMD_1 |
| SRC_STREAM_ID_1 | 23:18 | Selects Stream ID |
| SRC_FILT_ID_1 | 17:12 | Selects Filter ID |
| (Reserved) | 11:10 | |
| SRC_IO_INDEX_1 | 9 | 0 = IO0 for input, IO1 for output, 1 = IO0 for output, IO1 for input |
| SRC_OUTPUT_MIX_1 | 8 | 0 = Don't Mix SRC Output with Output Memory Contents, 1 = Add SRC Output to Output Memory Contents. |
| (Reserved) | 7:2 | |
| SRC_USE_GAIN_1 | 1 | 0 = Multiply all outputs by L 1 = Multiply all outputs by SRC_GAIN |
| (Reserved) | 0 | |
| | | SRC_CMD_2 |
| SRC_STREAM_ID_2 | 23:18 | Selects Stream ID |
| SRC_FILT_ID_2 | 17:12 | Selects Filter ID |
| (Reserved) | 11:10 | |
| SRC_IO_INDEX_2 | 9 | 0 = IO0 for input, IO1 for output, 1 = IO0 for output, IO1 for input |

-continued

| Field Name | Bit(s) | Description |
|---|---|---|
| SRC_OUTPUT_MIX_2 | 8 | 0 = Don't Mix SRC Output with Output Memory Contents,<br>1 = Add SRC Output to Output Memory Contents. |
| (Reserved) | 7:2 | |
| SRC_USE_GAIN_2 | 1 | 0 = Multiple all outputs by L<br>1 = Multiply all outputs by SRC_GAIN |
| (Reserved) | 0 | |
| | | SRC_CMD_3 |
| SRC_STREAM_ID_3 | 23:18 | Selects Stream ID |
| SRC_FILT_ID_3 | 17:12 | Selects Filter ID |
| (Reserved) | 11:10 | |
| SRC_IO_INDEX_3 | 9 | 0 = IO0 for input, IO1 for output,<br>1 = IO0 for output, IO1 for input |
| SRC_OUTPUT_MIX_3 | 8 | 0 = Don't Mix SRC Output with Output Memory Contents,<br>1 = Add SRC Output to Output Memory Contents. |
| (Reserved) | 7:2 | |
| SRC_USE_GAIN_3 | 1 | 0 = Multiply all outputs by L<br>1 = Multiply all outputs by SRC_GAIN |
| (Reserved) | 0 | |
| | | SRC_GAIN |
| SRC_GAIN | 23:0 | When SRC_USE_GAIN_x is set, this value is multiplied by all outputs produced by the SRC. This register points to a stack of four registers; One for each command word. The gain for the first command is written first and the gain for the last command is written last. If it is not written to, the previous values are kept. |
| | | SRC_IOMEM_D0 |
| SRC_IOMEM_D0 | 23:6 | Data Input to IO Memory 0<br>When written to, IO Memory 0 address is auto-incremented |
| (Reserved) | 5:0 | |
| | | SRC_IOMEM_D1 |
| SRC_IOMEM_D1 | 23:6 | Data Input to IO Memory 1<br>When written to, IO Memory 1 address is auto-incremented |
| (Reserved) | 5:0 | |
| | | SRC_IOMEM_NUM_COUNT_0 |
| (Reserved) | 23:8 | |
| SRC_IOMEM_NUM_SAMP_0 | 7:0 | Number of output samples stored in IO Memory 0.<br>DSP reads this location to determine how many outputs to read.<br>During conversion, this will contain the number in inputs stored-could be useful for debugging. |
| | | SRC_IOMEM_NUM_COUNT_1 |
| (Reserved) | 23:8 | |
| SRC_IOMEM_NUM_SAMP_1 | 7:0 | Number of output samples stored in IO Memory 1.<br>DSP reads this location to determine how many outputs to read.<br>During conversion, this will contain the number in inputs stored-could be useful for debugging. |
| | | SRC_COEF_D |
| SRC_COEF_D | 23:6 | Data Input to Coefficient Memory |
| (Reserved) | 5:0 | |
| | | SRC_COEF_A |
| (Reserved) | 23:9 | |
| SRC_COEF_A | 8:0 | Address of Coefficient Memory<br>Used to load Coefficients before conversion starts.<br>During conversion, this can be read for debug purposes |
| | | SRC_RES_D |
| SRC_RES_D | 23:6 | Data Input to Residue Memory |
| (Reserved) | 5:0 | |
| | | SRC_RES_A |
| (Reserved) | 23:9 | |
| SRC_RES_A | 10:0 | Address of Residue Memory<br>Used to load Residue Memory before conversion starts.<br>During conversion, this can be read for debug purposes |

During initialization, coefficient memory is filled with filter coefficients by the DSP. A filter type must be defined. This includes the upsampling rate L, downsampling rate M, number of samples to store res_len, and the address of the first coefficient, coef_start. Preferably, the number of coefficients stored is equal to L multiplied by res_len. Thus it may be necessary to store zero-valued coefficients at the end of a coefficient list. This information may be stored at the start of coefficient memory as follows.

| L | M | SRC_FILT_ID * 2 + 1 |
|---|---|---|
| res_len | coef_start | SRC_FILT_ID * 2 |
| 17  9 | 8  0 | |

For example, where L=7, M=4, res_len=5, coef_start= 130 and SRC_FILT_ID=3 (if defining the fourth filter type). The coefficient memory may be 512 words to be allocated as necessary and no coefficients should be written over the first locations that contain the filter identification information. The DSP writes coefficient memory with this data:

| 000000111 | 000000100 | location 7 |
|---|---|---|
| 000000101 | 010000010 | location 6 |
| 17  9 | 8  0 | |

The filter must contain L*res_len coefficients or 35 in this case. These coefficients are stored in order in location 130 to 164 for example. Other filters may be defined similarly, each with their own SRC_FILT_ID. Preferably, different filters can point to the same set of coefficients. To facilitate this, res_len and the number of coefficients should be chosen such that there are L*res_len coefficients.

Even though the coefficients will likely be symmetrical about the middle coefficient, this fact is not taken advantage of at this point. All coefficients must be stored. Also, it is not optimized for half-band polyphase filters. If there are a number of zero-valued coefficients, they should all be stored. Coefficient memory is written to by first writing the address in SRC_COEF_A and then writing the value in SRC_COEF_D.

The residue memory should also be set up before conversion can commence. As the SRC is used, many different streams will be operated on. Each of these streams has some memory reserved for it. Each stream uses a certain filter type. This determines the number of samples to be stored, res_len. A different starting address, res_start should be defined for each stream. The stream input samples are preferably stored from address res_start to address res_start+res_len−1. The start of residue memory may be configured as follows:

| offset | res_cur | SRC_STREAM_ID * 2 + 1 |
|---|---|---|
| | res_start | SRC_STREAM_ID * 2 |
| 17  9 | 8  0 | |
| 10 | 0 | |

The variable offset and res_cur values should initially be stored as zero. They are updated as the SRC is used and are not used by the DSP. For example, SRC_STREAM_ID=0 (first stream) and res_start=1030. Preferably there are 2 k words of residue memory to be allocated as necessary, and none of the streams are written over the first locations which contain the filter ID information. The DSP then writes the residue memory with this data:

| 17  9 | 8 | 0 | |
|---|---|---|---|
| 000000000 | 000000000 | | location 1 |
| 0000000 | 10000000110 | | location 0 |
| 10 | | 0 | |

Assuming use of the filter defined above, there will be 5 samples stored because res_len=5. These are preferably stored in locations 1030 to 1034. Initially, these words should be set to zero. Residue memory is written to by first writing the address in SRC_RES_A and then writing the value in SRC_RES_D.

During normal operation, all of the filter types and all of the streams have been initialized as above, and sample rate conversion can begin. The SRC facilitates a number of different possible conversions.

For simple conversion, one of the I/O memories is loaded with input data. The SRC is instructed by the DSP to do a conversion on a certain stream, specified by SRC_STREAM_ID, using a certain filter, specified by SRC_FILT_ID. The converted output is stored in the other I/O memory without adding the converted output to the contents of the other memory. The amount of converted output produced depends on the previous history of the current stream, and M and L. Specifically, the number of output samples is calculated as [(total number of inputs since start of stream)*L/M−(total number of outputs since start of stream)]. This number may have a decimal portion due to dividing by M. In this case, the number of outputs is rounded up to the nearest integer. In the case where there is no remainder, this value is the number of outputs. In this case (no remainder), the stream will look the same as the start of the stream, so the total number of inputs and outputs can be reset to zero. These calculations could be done contemporaneously as needed by the DSP or they could be precomputed and stored in DSP memory or other memory. The SRC sets SRC_IOMEM_NUM_SAMP_x to the number of outputs produced. This is then available to be read by the DSP after the conversion is finished so the DSP knows the number of output samples produced.

The command word is set as follows. The bit SRC_OUTPUT_MIX_0 is set to 0 (store outputs without summing), and SRC_IO_INDEX_0 is set depending on which I/O memory is set as input and which is set as output. SRC_RETRIG and SRC_CMD_SET_SIZE SRC_DBUG are set to 0 and 00 and 0 respectively. SRC_FILT_ID_0 and SRC_STREAM_ID_0 are set accordingly. First I/O memory 0 is loaded with 10 samples. This is done by writing the 10 pieces of data to SRC_IOMEM_D0. The address will start at zero (set at reset or the end of the previous conversion by the SRC) and autoincrements as SRC_IOMEM_D0 is written to. Then the command word is written to SRC_CMD_0. It would contain the following command: 000000000011000000000000 (Filter 3, Stream 0).

As soon as the command word is written, conversion starts on the next clock. When finished, the DSP receives an interrupt. Next the DSP reads from SRC_IOMEM_NUM_SAMP_1 (IO Memory 1 is output) to determine the number of converted output samples (18). The DSP then reads SRC_IOMEM_Q1 18 times. Once 18 reads are performed on SRC_IOMEM_Q1, it's address pointer is reset to 0 so that writing can occur to this memory if necessary. Then the next 10 samples are written to SRC_IOMEM_D0. The same command word is written, and upon interrupt, 17 words are read.

Another form of conversion performed by the SRC is conversion with mixing. In conversion with mixing, one I/O memory is loaded with input. The other I/O memory is loaded with input that is to be mixed with the output produced by the conversion engine 116. For example, if 20 samples of 8 kHz data are to be converted and mixed with 40 samples at 16 kHz. The 20 samples are loaded into I/O memory 0, the 40 samples into I/O memory 1 and the following command word is written: 00000000000000100000000 (Filter 0, Stream 0). This is assuming that Filter 0 is a 1:2 converter. The conversion engine 116 receives the data to be mixed through the I/O controller and sums the received data with data that it has just been converted to perform mixing. The conversion engine 116 sends the mixed data to the same I/O memory.

Next, if the 40 samples at 16 kHz (mixed) are to be converted and added to 80 samples at 32 kHz. I/O memory 1 contains the 16 kHz data so the 32 kHz data is loaded into I/O memory 0. After that, the command is issued that uses I/O memory 1 as input, adds the output to I/O memory 0 and again uses filter 0. This is a different stream so a different stream ID is chosen, stream 1 for the example. The command word is: 00000100000001100000000.

The SRC also performs multi-staged filtering where a conversion requires several stages but no mixing. Up to four stages can be specified using SRC_CMD_0 to SRC_CMD_3. SRC_CMD_0 is the last stage of the filter. It is written to last. Once written to, conversion commences. It will specify how many commands are being issued in SRC_CMD_SET SIZE. (In the previous examples, it was set to 00 indicating only one stage.) For example, where input is stored in I/O memory 0 and it is to be converted using filter 0, followed by filter 1 followed by filter 2, the converted output ends up in I/O memory 1 after the 3 passes. Three different streams are used, for example streams 5, 6 and 7. After the data is written to I/O memory 0, the following command words are written in the following order:

SRC_CMD_2=000101000000XX0000000000
SRC_CMD_1=000110000001XX0100000000
SRC_CMD_0=000111000010100000000000

Once all three passes are complete, the SRC interrupts the DSP.

The SRC also facilitates retriggering of the DSP to allow the DSP to service other interrupts. Hence, when the DSP is servicing the SRC, it has the option of leaving and coming back later. For instance, the DSP may not be finished writing to 1/0 memory when another interrupt comes from the host bus or other interrupt source that must be serviced. In order to leave the SRC, the DSP sets SRC_RETRIG (i.e., set SRC_CMD_0=00000000000000000000001). This causes the SRC to retrigger the interrupt after a predetermined number of clock cycles (preferably around 10). The retrigger interrupt causes the DSP to come back to the SRC. Preferably, the SRC 16 will not start conversion until SRC_CMD_0 is written to with SRC_RETRIG set to 0.

It should be understood that the implementation of other variations and modifications of the invention in its various aspects will be apparent to those of ordinary skill in the art, and that the invention is not limited by the specific embodiments described. It is therefore contemplated to cover by the present invention, any and all modifications, variations, or equivalents that fall within the spirit and scope of the basic underlying principles disclosed and claimed herein.

What is claimed is:

1. A sample rate conversion system for converting data sampled at different rates comprising:
   first means for receiving a plurality of input data streams wherein each input data stream contains data sampled at a different rate;
   residue memory means, operatively coupled to the first means for receiving, for receiving and simultaneously storing previous data samples separately for each of the plurality of input data streams;
   second means for receiving the plurality of input data streams and for communicating the input data streams to the first means for receiving;
   means for generating variable converter rate control data to facilitate a programmable conversion of the input data streams based on the variable converter rate control data;
   means, operatively coupled to the first means for receiving the residue memory and responsive to the variable converter rate control data, for alternately converting each of the plurality of input data streams to output data representing at least one input data stream as if it were sampled at a different rate, based on the stored previous samples for each input data stream and the variable converter rate control data.

2. The sample rate conversion system of claim 1 wherein the first means for receiving the plurality of input data also stores converted output data representing the at least one input data stream as if it were sampled at a different rate.

3. The sample rate conversion system of claim 2 wherein the first means for receiving is comprised of:
   first bidirectional (I/O) memory means for selectively receiving the plurality of input streams and for selectively storing the converted output data; and
   second bidirectional (I/O) memory means for selectively receiving the plurality of input streams and for selectively storing the converted output data,
   wherein each of the first and second bidirectional memory means are individually selectable by control means for controlling when each of the first and second bidirectional memory means receives at least one of the input streams and when each of the first and second bidirectional memory means stores converted output data samples to facilitate multi-input stream conversion.

4. The sample rate conversion system of claim 3 wherein the means for generating variable converter rate control data generates command data to the means for alternately converting to facilitate multistage conversion by storing first converted data in the first bidirectional memory means and again converting the first converted data to second converted data and storing the second converted data in the second bidirectional memory means for output.

5. The sample rate conversion system of claim 4 wherein the command data includes data representing: when the means for alternately converting starts conversion, which of the first or second bidirectional memories is an input memory and which is an output memory, whether to add output data to contents of the output memory, which FIR filter to use for conversion and which stream to operate on.

6. The sample rate conversion system of claim 5 further including means, associated with a sample rate converter, for generating an interrupt signal to facilitate retrieval of the output data in response to the interrupt signal.

7. The sample rate conversion system of claim 6 wherein the means for generating an interrupt signal also determines if a command register has been accessed and generates an interrupt retrigger based on the determination.

8. The sample rate conversion system of claim 4 wherein the means for alternately converting each of the plurality of input data streams is responsive to the command data to effect a programmable conversion of the input data streams.

9. The sample rate conversion system of claim 4 wherein the means for alternately converting also serves as means for mixing multiple input data streams by summing converted stream data with initial data stored in the first bidirectional memory means and replacing the initial data in the first bidirectional memory means with resulting summed data. streams.

10. The sample rate conversion system of claim 1 wherein the first means for receiving is on a sample rate conversion integrated circuit and the second means for receiving is a separate digital signal processor (DSP) located on a same chip as the sample rate conversion integrated circuit.

11. The sample rate conversion system of claim 10 wherein the DSP is operatively coupled to a host bus and the second means for receiving receives the plurality of input data streams containing data sampled ata different rate from a plurality of audio sources.

12. The sample rate conversion system of claim 1 wherein the input data streams are multiple differing rate digital audio streams.

13. The sample rate conversion system of claim 1 wherein the means for alternately converting each of the plurality of input data streams controls the timing of the residue memory means as to when it receives the data samples for each separate input stream from the first means for receiving.

14. The sample rate conversion system of claim 1 wherein the means for generating variable converter rate control data generates command data to the means for alternately converting to also mix data streams after conversion.

15. The sample rate conversion system of claim 1 wherein means for alternately converting each of the plurality of input data streams further includes coefficient memory means for storing sets of filter coefficients corresponding to each of a plurality of predetermined conversion filters to facilitate conversion of the multiple input data streams.

16. The sample rate conversion system of claim 1 wherein the second means for receiving is a digital signal processor that transfers input data streams to the first means for receiving and the residue memory means stores the previous data samples separately for each input data stream to facilitate a reduction in the amount of data transferred from the digital signal processor when switching input data streams.

17. A sample rate conversion system for converting data sampled at different rates comprising:
    first means for receiving a plurality of digital input audio data streams wherein each input audio data stream contains audio data sampled at a different rate;
    residue memory means, operatively coupled to the first means for receiving, for receiving and simultaneously storing previous audio data samples separately for each of the plurality of input audio data stream;
    second means for receiving the plurality of input audio data stream and for communicating the input audio data stream to the first means for receiving;
    means for generating variable converter rate control data to facilitate a programmable conversion of the input audio data stream based on the variable converter rate control data and for generating command data to facilitate mixing of data streams after conversion;
    means, operatively coupled to the first means for receiving, the residue memory and responsive to the variable converter rate control data, for alternately converting each of the plurality of input audio data stream to output data representing at least one input data stream as if it were sampled at a different rate, based on the stored previous samples for each input data stream and the variable converter rate control data, and further including coefficient memory means for storing sets of filter coefficients corresponding to each of a plurality of predetermined decimation filters to facilitate conversion of the multiple input data streams.

18. The sample rate conversion system of claim 17 wherein the first means for receiving is comprised of:
    first bidirectional (I/O) memory means for selectively receiving the plurality of input streams and for selectively storing the converted output data; and
    second bidirectional (I/O) memory means for selectively receiving the plurality of input streams and for selectively storing the converted output data,
    wherein each of the first and second bidirectional memory means are individually selectable by control means for controlling when each of the first and second bidirectional memory means receives at least one of the input streams and when each of the first and second bidirectional memory means stores converted output data samples to facilitate multi-input stream conversion.

19. The sample rate conversion system of claim 17 wherein the means for alternately converting mixes multiple input data streams by summing converted stream data with initial data stored in the first bidirectional memory means and replacing the initial data in the first bidirectional memory means with resulting summed data.

20. A sample rate conversion method for converting audio data sampled at different rates comprising:
    receiving a plurality of input audio data streams using a first receiving means, wherein each input audio data stream contains audio data sampled at a different rate;
    communicating the input audio data streams to the first means for receiving the plurality of input audio data streams;
    receiving and simultaneously storing previous audio data samples separately for each of the plurality of input audio data streams in residue memory;
    generating variable converter rate control data to facilitate a programmable conversion of the input audio data streams based on the variable converter rate control data; and
    alternately converting each of the plurality of input audio data streams to output data representing at least one input audio data stream as if it were sampled at a different rate, based on the stored previous samples for each input audio data stream and the variable converter rate control data.

21. The sample rate conversion method of claim 20 wherein the first means for receiving is on a sample rate conversion integrated circuit and a separate digital signal processor performs the step of receiving the plurality of input audio data streams wherein each input audio data stream contains audio data sampled at a different rate.

22. The sample rate conversion method of claim 21 wherein the step of alternately converting each of the plurality of input data streams includes controlling when the residue memory receives the audio data samples for each separate input audio stream from the first means for receiving.

23. The sample rate conversion method of claim 20 wherein the step of generating variable converter rate control data includes generating command data to facilitate multistage conversion by storing first converted data in the first bidirectional memory and again converting the first converted data to second converted data and storing the second converted data in the second bidirectional memory for output.

24. The sample rate conversion method of claim 23 wherein the step of generating command data includes generating data representing: when the means for alternately converting starts conversion, which of the first or second bidirectional memories is an input memory and which is an output memory, whether or not to add output data to contents of the output memory, which FIR filter to use for conversion and which stream to operate on.

25. The sample rate conversion method of claim 20 wherein the step of generating variable converter rate control data includes the step of generating command data to also mix data streams after conversion.

26. The sample rate conversion method of claim 20 wherein the step of alternately converting includes the steps of selectively receiving the plurality of input audio streams and for selectively storing the converted output data in a first bidirectional (I/O); and selectively receiving the plurality of input audio streams and for selectively storing the converted output data in a second bidirectional (I/O) memory, wherein each of the first and second bidirectional memories are individually selectable by control means for controlling when each of the first and second bidirectional memory means receives at least one of the input audio streams and when each of the first and second bidirectional memories stores converted output data samples to facilitate multi-input stream conversion.

* * * * *